United States Patent [19]

Hall

[11] 4,147,988
[45] Apr. 3, 1979

[54] CHANNEL MULTIPLIER PLATE CRT SCAN CONVERTER AND SCAN CONVERSION METHOD

[75] Inventor: Dennis R. Hall, Beaverton, Oreg.

[73] Assignee: Tektronix, Inc., Beaverton, Oreg.

[21] Appl. No.: 802,616

[22] Filed: Jun. 2, 1977

[51] Int. Cl.$^2$ .................. G11C 11/42; G11C 11/26
[52] U.S. Cl. .................. 328/124; 313/103 CM; 365/217
[58] Field of Search .............. 328/124, 123; 313/103, 313/103 CM, 104, 105; 365/217, 237, 118

[56] References Cited

U.S. PATENT DOCUMENTS

| | | | |
|---|---|---|---|
| 3,341,730 | 9/1967 | Goodrich et al. | 313/103 |
| 3,389,293 | 6/1968 | Greutman | 315/12 |
| 3,555,345 | 1/1971 | Collings | 313/103 X |
| 3,657,596 | 4/1972 | Goetze | 313/103 X |
| 3,675,134 | 7/1972 | Luedicke et al. | 328/124 |
| 3,699,375 | 10/1972 | Weibel | 313/95 |
| 3,748,585 | 7/1973 | Culter et al. | 328/124 |
| 3,760,216 | 9/1973 | Lasser et al. | 313/103 X |
| 3,778,786 | 12/1973 | Fletcher et al. | 365/217 |
| 3,864,595 | 2/1975 | Lawrence | 313/103 X |
| 3,947,841 | 3/1976 | Tumolillo | 313/103 CM |
| 3,982,191 | 9/1976 | Takita et al. | 328/124 |
| 3,988,634 | 10/1976 | Denham et al. | 328/124 X |
| 4,005,407 | 1/1977 | Parks | 328/124 X |

OTHER PUBLICATIONS

*Review of Scientific Instruments*, pp. 400–405, Apr. 1973, "Application of Channel Multiplier Plates as Image Information Preprocessors", by Seko & Kobayashi.
*Computer Design*, pp. 75–79, Dec. 1975, "Electro-Optical Scan Converter Shares Benefits of Conventional Units" by Poley.

*Primary Examiner*—John S. Heyman
*Attorney, Agent, or Firm*—John D. Winkelman

[57] ABSTRACT

An electron beam scan conversion method and apparatus based on the gain recovery or "dead" time characteristic of channel electron multipliers. The waveform of an electrical signal is written on the input face of a channel multiplier plate with an electron beam. Then, within the dead time of the written channels (typically about 1–100 msec.), the plate's input face is scanned in a predetermined raster pattern with a constant current beam. During the scanning step, an output signal is derived that corresponds to the difference in emission in response to the scanning beam between the channels in the written area of the plate and those outside that area.

17 Claims, 2 Drawing Figures

CHANNEL MULTIPLIER PLATE CRT SCAN CONVERTER AND SCAN CONVERSION METHOD

The present invention relates generally to electron beam scan conversion of electrical signals, and more particularly to an improved method and apparatus for converting high speed analog signals to slower analog or digital signals.

In a variety of situations—for example, in work with pulsed lasers for fusion studies, in infrared laser meterology, and in nuclear and explosive testing—there is a need to analyze electrical transients from brief, single or seldom occurring events. Before a fast transient signal can be studied in detail, however, it must be captured and converted to an analyzable form. For a number of reasons, it is preferable to convert such signals into coded digital form.

A once common conversion technique was to photograph an oscilloscope display of a transient signal, then manually convert the pictured waveform to binary coded digital (BCD) form for computer analysis. The drawbacks of this method in terms of speed, accuracy, and convenience are obvious.

Storage oscilloscopes with direct view storage CRTs have been used to observe and record transients in the microsecond range. An electrical read-out of the stored waveform is obtained by scanning the CRT's storage target in a raster pattern with a constant current electron beam as described, for example, in U.S. Pat. No. 3,312,850 to McMillan, Jr. et al. Digitalization of the read-out signal is accomplished using an analog-to-digital converter (ADC) synchronized with the scanning beam.

Special purpose instruments known as transient digitizers have been used to capture and store high speed transients at frequencies in the subnanosecond risetime range. In one commercially available version of such an instrument, the transient signal is used to deflect a high velocity electron beam, which writes the signal waveform on a silicon diode array storage target in a double-ended scan converter CRT. Such a tube is disclosed in U.S. Pat. No. 3,748,585 to Culter et al. After the signal has been recorded, the target is scanned by a low velocity reading beam in a series of steps. At each step, circuitry in the instrument determines whether the target area under the beam has been written. When a written area is detected, a BCD output signal is generated describing the location of the area on the target. These signals are stored in a memory for computer analysis of the transient waveform.

Conventional direct view storage oscilloscopes do not have sufficient writing speed to capture non-repetitive, high speed transient signals. Although transient digitizers of the type described above permit extremely fast-rise signals to be acquired and converted to digital format, the scan converter storage CRTs used in such instruments are complex and expensive to manufacture. Thus, a need exists for less complex, lower cost scan conversion apparatus capable of capturing high speed transient signals suitable for display or further processing.

Accordingly, a general object of the present invention is to satisfy the above-identified need in a practical and satisfactory manner.

A more specific object of the invention is to provide scan conversion apparatus employing a channel multiplier plate as a signal conversion element.

A further object of the invention is to provide an improved method and apparatus for converting a transient analog electrical signal to a convenient form for subsequent display, storage, or analysis.

Still a further object of the invention is to provide an improved method for digitizing an analog electrical signal by means that includes a channel multiplier plate-containing cathode-ray tube.

SUMMARY OF THE INVENTION

These and other objects of the invention are achieved through the utilization of the known "dead", or gain recovery, time characteristic of a channel electron multiplier (CEM) in pulsed operation. Briefly, the ability of a CEM to multiply input electrons drops quite substantially for a short period of time (typically about 1–100 milliseconds) after it produces an output pulse. Thus it has been found that by first writing the waveform of an electrical signal on the input face of a channel multiplier plate (CMP) with an electron beam, then immediately raster-scanning the face with a constant current "read" beam, an output signal can be derived on the basis of the difference in gain during scanning between the CEMs in the written areas of the plate and those outside those areas. The output signal, which contains the input signal information, suitably is amplified and converted to coded digital form for storage or further processing.

A more complete understanding and appreciation of the present invention and its advantages over prior art scan conversion methods and apparatus will be had by reference to the following detailed description and the accompanying drawing.

DETAILED DESCRIPTION

Figure 1:
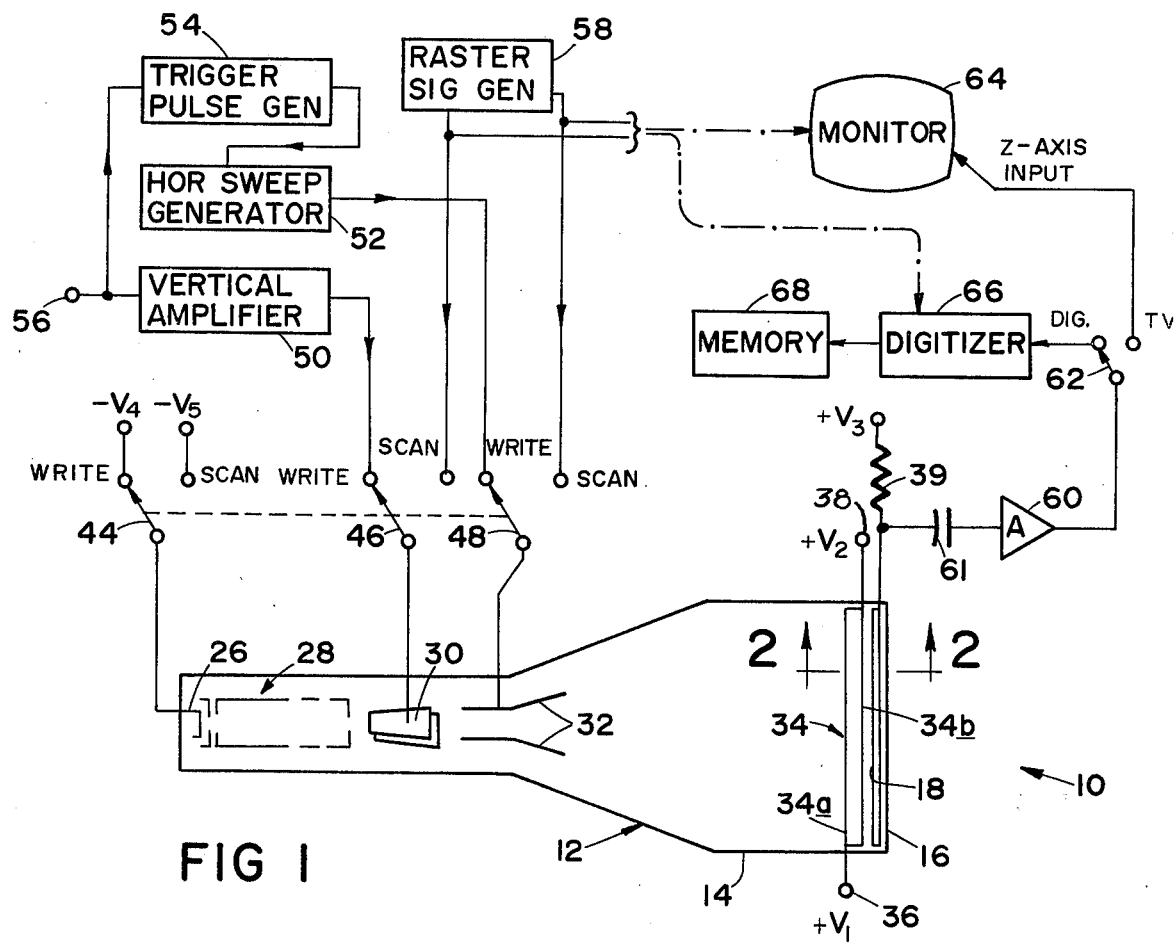
FIG. 1 is a diagrammatic view of scan conversion apparatus including a channel multiplier plate cathode-ray tube and associated electrical circuitry.

Referring now in detail to the drawing, an illustrative embodiment of a channel multiplier plate scan converter is indicated generally at 10 in FIG. 1. Scan converter 10 includes a cathode-ray tube 12 having an evacuated envelope 14 with a transparent faceplate 16 at one end. A display screen 18 comprising a phosphor layer 20 with an aluminum coating 22 (FIG. 2) is deposited on the inner surface of the faceplate. Coating 22 connects inside the envelope to a lead-in 24 provided for applying a potential to screen 18. At the opposite end of the tube is a conventional electron gun including a cathode 26 and an electrostatic lens structure 28. Vertical deflection plates 30 and horizontal deflection plates 32 are provided for deflecting the beam emitted from the electron gun.

A channel multiplier plate (also commonly referred to as a microchannel plate or MCP) 34 is mounted in CRT 12 in close, parallel spaced relation to screen 18. The CMP, which is essentially a two-dimensional array of single channel electron multipliers, is a well known device. Typically, the individual CEMs are formed of thin wall glass tubing, the inner bore of which is coated or treated to provide a surface that in response to impacting electrons emits secondary electrons in a ratio greater than unity. After having been arranged to define a plate of suitable configuration and dimensions, the individual channel multiplier tubes are fused together to form a unitary channel plate having an input face 34a and an output face 34b containing the input and output ends, respectively, of the individual CEMs. The input and output faces of plate 34 are coated with an electrically conductive material so that a voltage differential can be applied across the channels. The conductive coatings are connected by lead-ins (not shown) to terminals 36 and 38. A more complete description of a suitable CMP structure is given in U.S. Pat. No. 3,341,730 to Goodrich et al.

The individual channels of plate 34 have a diameter of about 10 microns and are arrayed with a center-to-center spacing of about 12 microns. The plate is about 0.030 inches thick, providing a channel 1:d ratio of about 60:1. The spacing between plate 34 and screen 16 will depend on the CMP design, the potential difference between the plate and screen, and other factors known to those of ordinary skill in the art, but suitably is in the range of about 0.05 to 0.5 inches.

Figure 2:
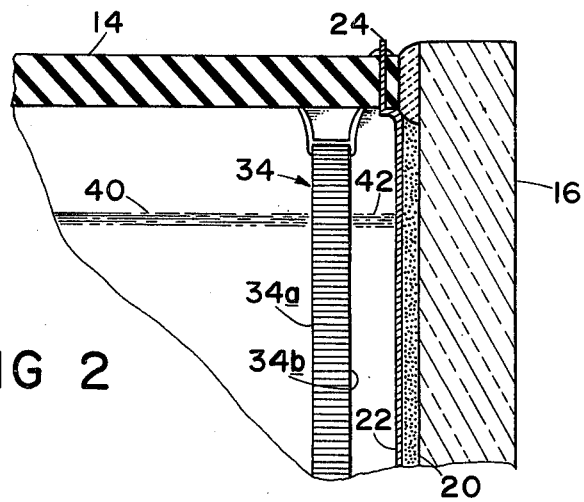
FIG. 2 is an enlarged, fragmentary sectional view taken along line 2—2 of FIG. 1 showing a portion of the CMP CRT.

During operation of the scan converter, a potential difference in the range of about 500 V. to about 5 kV. D.C., typically about 1 kV., is applied across CMP 34 via terminals 36, 38, with the output face voltage $V_2$ being more positive than the input face of voltage $V_1$. A voltage $V_3$ in the range of about 2 kV. to about 12 kV. more positive than $V_2$ is applied via a resistor 39 to screen 18. Referring to FIG. 2, when electrons from beam 40 enter the lower voltage input end of a CEM in plate 34 and strike its inner surface, secondary electrons are released and multiplied by further collisions as they are accelerated toward the output end by the voltage differential across the plate. The amplified output pulse 42 from CMP 34 is directed onto screen 18, as shown.

The emission of an output pulse from a CEM produces a depletion in electrons at its output end for a short period of time, known as the channel's recovery or "dead" time. The length of the dead time depends on the amount of charge removed by the output pulse, and the resistance and capacitance of the channel. Although it may last up to about one second, the dead time of a channel typically is in the range of about 1–100 milliseconds. The gain of a channel is substantially reduced during its dead time, and until equilibrium is reestablished, an input pulse following closely after a preceeding one will be amplified much less.

This characteristic of channel electron multipliers is utilized in the method and apparatus of the invention by scanning input face 34a of CMP 34 in a raster pattern immediately after the waveform of an input signal has been written on the input face by beam 40.

Separate electron guns may be provided for performing the steps of first writing a pattern corresponding to the waveform of an electrical signal on the plate's input face, then scanning the input face in a raster pattern during the dead time for the CEMs in the written area. However, in scan converter 10 a single gun is used for both functions. As shown in FIG. 1, three ganged switches 44, 46 and 48 connected, respectively, to cathode 26, vertical deflection plates 30 and horizontal deflection plates 32 are provided for switching between WRITE and SCAN positions. In the WRITE position of the three switches, cathode 26 is connected to a source of negative D.C. Voltage $V_4$ to produce a writing beam of high velocity electrons from the CRT gun.

The vertical deflection plates 30 are connected through switch 46 to the output of a vertical amplifier 50, and the horizontal deflection plates are connected through switch 48 to the output of a horizontal sweep generator 52. A trigger pulse generator 54 is arranged to trigger the horizontal sweep generator when an input signal, such as an electrical transient, is applied to the vertical amplifier's input terminal 56. In the SCAN position of the switches, cathode 26 is connected to a less negative D.C. Voltage $V_5$ to produce a scanning beam of lower velocity electrons. In addition, the vertical and horizontal deflection plates are both connected to a raster signal generator 58 by switches 46 and 48, respectively.

With switches 44, 46 and 48, in the WRITE position, a signal to be converted is applied to input terminal 56 of the vertical amplifier. As the signal is being amplified and transmitted to the vertical deflection plates, a sawtooth sweep signal from generator 52 is transmitted to the horizontal deflection plates. Thus, the writing beam formed by cathode 26 and lens structure 28 is deflected vertically and horizontally and directed onto the input face of CMP 34 in a pattern corresponding to the waveform of the input signal. The channel multipliers irradiated by the writing beam emit amplified pulses 42 of electrons from output face 34b that strike display screen 18 with sufficient energy to produce a visible display of the input signal waveform.

Switches 44, 46 and 48 are then moved immediately to their SCAN positions, connecting the vertical and horizontal deflection plates to raster signal generator 58 in order to scan a lower velocity electron beam over input face 34a in a predetermined raster pattern during the dead time for the channel multipliers previously irradiated by the writing beam. An electrical readout signal is derived from screen 18 by a video amplifier 60 connected via a capacitor 61 to amplify the voltage drop across resistor 39. As will be understood, screen current (and hence the voltage drop across resistor 39) will decrease as the scanning beam passes over previously written areas on the input face of plate 34.

Scan converter 10 is operable either in a TV or a DIGITAL output mode, selectable by means of a switch 62. In the TV mode, the output of video amplifier 60 is connected to the video signal or "Z-axis" input of a conventional TV monitor 64. As indicated in the drawing, monitor 64 is coupled to receive signals from raster signal generator 58 so that the vertical and horizontal sweep rates of the monitor are synchronized with those of CRT 12. The video signals from amplifier 60 intensity modulate the electron beam of the monitor's CRT to form a visible reproduction of the scan converted signal.

In the DIGITAL mode, the video output signal from amplifier 60 is connected to a digitizer, or analog-to-digital converter, 66. Digitizer 66 is a conventional device that generates coded binary signals containing CMP output and scanning beam position information, the latter obtained via an interconnection with raster signal generator 58. The output of digitizer 66 is fed to a suitable memory device 68, such as a random access memory unit (RAM) or a magnetic media storage device, in an address sequence correlated to the coordinates of the CMP input face. Thus a digital representation of the input signal is stored in a convenient form for computer processing and analysis.

The just described scan conversion method and apparatus provides a number of advantages compared with prior art systems, as those skilled in the art will appreciate. For example, because of the amplification provided by the CMP, very high writing rates equalling or exceeding those of prior art transient digitizers can be achieved with improved resolution. In addition, the trace blooming problem experienced with diode array target scan converters is eliminated, and a much simpler, less costly construction is provided.

Although in the illustrative embodiment of the channel multiplier plate scan conversion tube described herein an aluminized phosphor target screen is shown and described, a non-view CRT with a conductive target plate disposed opposite the output face of the CMP may be used instead. Also, separate writing and scanning guns and deflection systems may be used in place of the single, switched gun system described. In that connection, it will be understood that automatic switching of the gun between WRITE and SCAN modes is a desireable and practical alternative. Still other modifications will be apparent to those skilled in the art and may be made without departing from the full scope of the invention as defined by the following claims.

I claim:

1. Scan conversion apparatus that includes
a plurality of channel electron multipliers disposed in an array having an input face and an output face containing the input and output ends, respectively, of said multipliers, each multiplier in response to electron beam irradiation of its input end generating and emitting electrons at its output end with a gain that after a period of time following the start of such emission decreases substantially for a further time period,
writing means for at first times directing an electron beam onto said input face in accordance with an input signal thereby to irradiate the input ends of certain channel multipliers in said array,
scanning means for at second times during said further time period scanning an electron beam over said input face in a predetermined pattern,
collector means disposed adjacent said output face for collecting electrons emitted by said channel multipliers, and
output circuit means coupled to said collector means for deriving an output signal corresponding to the gain of the channel multipliers as the input face of the array is scanned.

2. The apparatus of claim 1, further including digitizing means coupled to said output circuit means for producing digital signals corresponding to said output signal.

3. The apparatus of claim 2, further including memory means coupled to said digitizing means for storing said digital signals in a predetermined sequence thereby to store a digital representation of said input sequence.

4. The apparatus of claim 1, wherein said collector means comprises a phosphor display screen.

5. Scan conversion apparatus that includes:
a microchannel plate comprising an array of channel electron multipliers, said plate having an input face and an output face containing the input and output ends, respectively, of said multipliers,
means for forming and directing a writing electron beam onto the input face of said plate in accordance with an input signal thereby to initiate channel multiplication in the multipliers irradiated by said beam,
means for subsequently directing a scanning electron beam over said input face in a predetermined pattern during the dead time for the previously irradiated multipliers,
means comprising a phosphor display screen disposed opposite the output face of said plate for collecting electrons emitted by said multipliers in response to irradiation by said writing and scanning beams, and
circuit means coupled to said collector means for deriving an output signal as said input face is scanned that corresponds to the difference in emission between the multipliers irradiated by said writing beam and those not so irradiated.

6. The apparatus of claim 5, further including digitizing means coupled to said circuit means for producing coded digital signals corresponding to said output signal.

7. The apparatus of claim 5, wherein the multipliers comprising said plate have a dead time in the range of about 0.1 to about 1000 milliseconds.

8. Scan conversion apparatus that includes
a cathode-ray tube having a phosphor display screen and an electron beam generation and deflection system spaced from said screen,
a two-dimensional array of channel electron multipliers disposed within said tube intermediate said screen and electron beam system, said array having an input surface facing said system and an output surface facing said screen,
said electron beam system including means for directing a writing beam onto said input surface in accordance with an input signal thereby to irradiate certain multipliers in a pattern corresponding to the waveform of said signal, and means for subsequently directing a scanning beam over the input surface in a predetermined pattern during the dead time for said certain multipliers,
collector means in said tube associated with said display screen for collecting electrons emitted by said multipliers in response to irradiation by said writing and reading beams, and
circuit means coupled to said collector means for deriving an output signal as the input surface of said array is scanned by the scanning beam, which signal corresponds to the difference in emission between said certain multipliers and other multipliers in the array.

9. The apparatus of claim 8, further including digitizing means coupled to said circuit means for producing coded digital signals corresponding to said output signal.

10. The apparatus of claim 9, further including memory means coupled to said digitizing means for storing said digital signals in a predetermined sequence thereby to store a digital representation of said input signal.

11. The apparatus of claim 8, wherein said collector means comprises a conductive layer disposed in contact with said display screen.

12. An electrical signal conversion method comprising the steps of:
writing a pattern corresponding to the waveform of an electrical signal on the input face of a channel multiplier plate using an electron source capable of triggering emission from channels in the written area of the plate,
subsequently during the dead time of the channels in the written area scanning an electron beam over said input face in a predetermined raster pattern, and deriving an output signal corresponding to the difference in electron emission in response to said scanning, between the multipliers in said written area and those outside said area.

13. The method of claim 12, further comprising the subsequential step of producing encoded digital signals corresponding to said output signal.

14. The method of claim 13, further comprising the subsequential step of storing said digital signals in a predetermined sequence thereby to store a digital representation of said input signal.

15. An electrical signal conversion method using apparatus that includes a plurality of channel electron multipliers disposed in an array having an input face and an output face containing the input and output ends, respectively, of said multipliers, means for forming and directing a writing electron beam onto the input face of said plate, means for forming and directing a scanning electron beam over said input face in a predetermined pattern, means disposed adjacent said output face for collecting electrons emitted by said channel multipliers, comprising the steps of directing said writing beam onto said input face in accordance with an electrical input signal to be converted, initiating channel multiplication in the multipliers irradiated thereby, subsequently directing said scanning beam over said face in said predetermined pattern during the dead time for the multipliers previously irradiated by the writing beam, collecting electrons emitted by the multipliers in said array as the input surface thereof is being scanned, and on the basis of the electrons so collected, deriving an output signal corresponding to the difference in emission between the multipliers irradiated by the writing beam and those not so irradiated.

16. The method of claim 15, further comprising the subsequential step of producing encoded digital signals corresponding to said output signal.

17. The method of claim 16, further comprising the subsequential step of storing said digital signals in a predetermined sequence thereby to store a digital representation of said input signal.

* * * * *